United States Patent
Harazono et al.

(10) Patent No.: US 10,602,622 B2
(45) Date of Patent: Mar. 24, 2020

(54) WIRING BOARD

(71) Applicant: KYOCERA Corporation, Kyoto-shi, Kyoto (JP)

(72) Inventors: Masaaki Harazono, Kirishima (JP); Takayuki Umemoto, Omihachiman (JP); Hidetoshi Yugawa, Kyoto (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 0 days.

(21) Appl. No.: 16/129,847

(22) Filed: Sep. 13, 2018

(65) Prior Publication Data

US 2019/0132962 A1 May 2, 2019

(30) Foreign Application Priority Data

Oct. 27, 2017 (JP) .................................. 2017-207874
Jan. 24, 2018 (JP) .................................. 2018-009458

(51) Int. Cl.
*H05K 1/02* (2006.01)
*H05K 1/11* (2006.01)
(Continued)

(52) U.S. Cl.
CPC ............. *H05K 3/4676* (2013.01); *H01B 3/40* (2013.01); *H05K 1/0284* (2013.01);
(Continued)

(58) Field of Classification Search
CPC ........ H05K 3/4676; H05K 3/38; H05K 3/181; H05K 3/4602; H05K 3/0094; H05K 3/067; H05K 2201/0358; H05K 2201/0209; H05K 2203/072; H05K 1/0237; H05K 1/0242; H05K 1/0256; H05K 1/0263; H05K 1/0271; H05K 1/0284; H05K 1/0353;
(Continued)

(56) References Cited

U.S. PATENT DOCUMENTS 6,930,258 B1 * 8/2005 Kawasaki ......... H01L 23/49811
174/255
8,110,750 B2 * 2/2012 Inagaki ............... H01L 21/4857
174/260
(Continued)

FOREIGN PATENT DOCUMENTS

JP 2013-012726 A 1/2013
KR 20130018819 A 2/2013

*Primary Examiner* — Ishwarbhai B Patel
(74) *Attorney, Agent, or Firm* — Volpe and Koenig, P.C.

(57) ABSTRACT

A wiring board includes a first insulating layer including a surface having unevenness, a second insulating layer including a surface having unevenness, laminated on the first insulating layer, and made of the same insulating material as that of the first insulating layer, insulating particles contained in the first and second insulating layers at rate of 40 to 80 wt %, a first wiring conductor on a first underlying metal layer surface, and a second wiring conductor on a second underlying metal layer surface. A second level difference of the unevenness in a surface region of the second insulating layer under the second wiring conductor is smaller than a first level difference of the unevenness in a surface region of the first insulating layer under the first wiring conductor, and the second level difference is not more than ⅔ of an average particle size of the insulating particles.

11 Claims, 5 Drawing Sheets

(51) Int. Cl.
  *H05K 3/46* (2006.01)
  *H05K 3/00* (2006.01)
  *H01B 3/40* (2006.01)
  *H05K 3/06* (2006.01)
  *H05K 3/18* (2006.01)
  *H05K 3/38* (2006.01)
  *H05K 1/03* (2006.01)

(52) U.S. Cl.
  CPC ......... *H05K 1/0353* (2013.01); *H05K 1/0373* (2013.01); *H05K 1/11* (2013.01); *H05K 1/119* (2013.01); *H05K 3/0094* (2013.01); *H05K 3/067* (2013.01); *H05K 3/181* (2013.01); *H05K 3/38* (2013.01); *H05K 3/4602* (2013.01); *H05K 1/0298* (2013.01); *H05K 1/0313* (2013.01); *H05K 2201/0209* (2013.01); *H05K 2201/0358* (2013.01); *H05K 2203/072* (2013.01)

(58) Field of Classification Search
  CPC ........ H05K 1/0373; H05K 1/119; H05K 1/18; H05K 1/181; H05K 3/30; H01B 3/40
  See application file for complete search history.

(56) References Cited

U.S. PATENT DOCUMENTS

| | | | |
|---|---|---|---|
| 2007/0082183 A1* | 4/2007 | Murai | H05K 3/421 |
| | | | 428/209 |
| 2007/0164349 A1* | 7/2007 | Nakasato | H01L 21/6835 |
| | | | 257/318 |
| 2011/0240358 A1 | 10/2011 | Nakai et al. | |
| 2012/0067632 A1* | 3/2012 | Nakai | H05K 3/027 |
| | | | 174/258 |
| 2013/0000965 A1* | 1/2013 | Shin | H01B 3/40 |
| | | | 174/258 |
| 2014/0174797 A1* | 6/2014 | Shim | H05K 1/0373 |
| | | | 174/255 |
| 2015/0195902 A1* | 7/2015 | Lee | H05K 3/4682 |
| | | | 174/251 |
| 2015/0357276 A1* | 12/2015 | Shimizu | H01L 23/49822 |
| | | | 361/783 |
| 2016/0338195 A1* | 11/2016 | Ikeda | H05K 1/0298 |

* cited by examiner

WIRING BOARD

BACKGROUND OF THE INVENTION

1. Field of the Invention

The present disclosure relates to a wiring board including fine wirings.

2. Description of the Related Art

A wiring board including fine wiring conductors on an insulating layer at a high density is now under development. Such a wiring board is used in highly functional electronic devices represented by a server and a supercomputer. The insulating layer used in that wiring board contains an insulating resin and insulating particles dispersed in the insulating resin. (See, e.g., Japanese Unexamined Patent Application Publication No. 2013-012726)

Regarding the wiring conductors in the wiring board, a surface of each wiring conductor is desired to be flat particularly from the viewpoint of transferring high frequency signals with high efficiency. On the other hand, a surface of the insulating resin is desired to be roughed from the viewpoint of ensuring high adhesion between the wiring conductor and the insulating layer. In some cases, however, the insulating layer used in the above-described wiring board contains the insulating particles dispersed at a high density with intent to reduce the thermal expansion rate of the wiring board and to prevent disconnection of the wiring conductor. In such a case, when the surface of the insulating resin is formed with smaller roughness to suppress the influence of unevenness attributable to the insulating particles, the strength of adhesion with respect to the wiring conductor decreases. To the contrary, when the surface of the insulating resin is formed with larger roughness to increase the strength of the adhesion, the unevenness in the surface of the wiring conductor increase and transfer characteristics of the high frequency signals degrade. Thus, there is a possibility that a difficulty arises in realizing good transfer characteristics and high adhesion at the same time.

SUMMARY OF THE INVENTION

The present disclosure provides a wiring board including a first insulating layer including a surface having unevenness, a second insulating layer including a surface having unevenness, laminated on the first insulating layer, and made of an insulating material of same type as an insulating material of the first insulating layer, a plurality of insulating particles contained in each of the first insulating layer and the second insulating layer at rate of 40 to 80 wt %, and including partly exposed particles which exposed at the surface of the first insulating layer and the surface of the second insulating layer, a first underlying metal layer situating from the surface to the inside of the first insulating layer, a second underlying metal layer situating from the surface to the inside of the second insulating layer, a first wiring conductor on a surface of the first underlying metal layer, and a second wiring conductor on a surface of the second underlying metal layer, wherein a second level difference of the unevenness in a region of the surface of the second insulating layer under the second wiring conductor is smaller than a first level difference of the unevenness in a region of the surface of the first insulating layer under the first wiring conductor, and the second level difference is not more than $2/5$ of an average particle size of the insulating particles.

According to the present disclosure, the wiring board having good transfer characteristics of high frequency signals and high adhesion between the wiring conductor and the insulating layer can be obtained.

DESCRIPTION OF THE PREFERRED EMBODIMENTS

Figure 1:
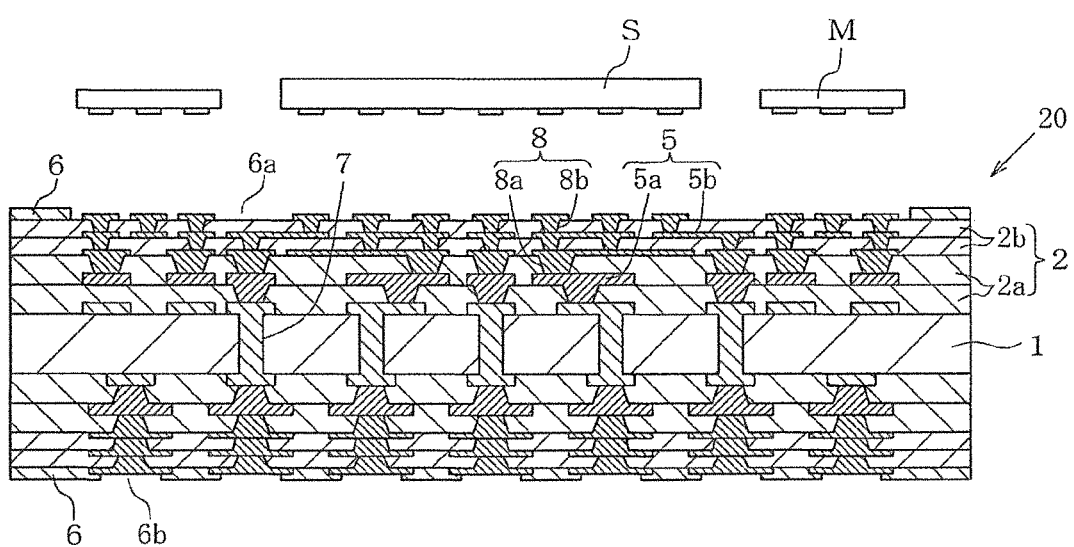
FIG. 1 is a schematic sectional view illustrating an example of a wiring board according to the present disclosure.

A wiring board according to the present disclosure will be described below with reference to FIGS. 1 to 4. A wiring board 20 includes a core insulating layer 1, buildup insulating layers 2, insulating particles 3, underlying metal layers 4, wiring conductors 5, and solder resists 6. A highly functional integrated circuit S and a plurality of high bandwidth memories M are mounted, for example, to an upper surface of the wiring board 20.

The core insulating layer 1 contains an insulating material made of, for example, a reinforcement glass cloth impregnated with an epoxy resin, a bismaleimide triazine resin, or the like. The core insulating layer 1 functions as a reinforcement support in the wiring board 20. The core insulating layer 1 includes a plurality of through-holes 7 vertically penetrating therethrough. A thickness of the core insulating layer 1 is set to, for example, 200 to 1200 μm. A diameter of each through-hole 7 is set to, for example, 50 to 200 μm. The wiring board 20 is in the form of a flat plate having a rectangular shape when viewed in plan. A length of one side of the wiring board 20 is about 20 to 80 mm, and a thickness of the wiring board 20 is about 0.3 to 1.6 mm.

The core insulating layer 1 is formed into a flat plate by laminating a plurality of prepregs each of which is made of a reinforcement glass cloth impregnated with a thermosetting resin, such as an epoxy resin or a bismaleimide triazine resin, and by pressing the laminated prepregs under heating. The through-holes 7 are formed in the core insulating layer 1 by drilling, laser processing, or blasting, for example. The wiring conductors 5 on upper and lower surfaces of the core insulating layer 1 are electrically connected to each other via the wiring conductors 5 in the through-holes 7.

Each of the buildup insulating layers 2 includes a first insulating layer 2a and a second insulating layer 2b. The wiring conductor 5 primarily serving to connect the highly functional integrated circuit S and the wiring conductor 5 on the lower surface of the wiring board 20 is positioned on an upper surface of the first insulating layer 2a at the upper side of the core insulating layer 1. The wiring conductor 5 serving to connect the highly functional integrated circuit S and the high bandwidth memories M is positioned on an upper surface of the second insulating layer 2b at the upper side of the core insulating layer 1. The first insulating layer 2a and the second insulating layer 2b have surfaces each having unevenness.

The first insulating layer 2a and the second insulating layer 2b contain the same type of insulating material such as an epoxy resin, a phenol resin, or cyanate ester. Using the same type of insulating material enables a difference in thermal expansion and contraction to be suppressed between the first insulating layer 2a and the second insulating layer 2b, and is advantageous, for example, in suppressing warpage of the wiring board 20. The wording "same type" implies that the first insulating layer 2a and the second insulating layer 2b basically have the same resin composition. However, resin combinations are just required to satisfy that network polymers containing the above-mentioned resins as main components can be formed. Thus, any suitable one of the combinations providing the network polymers may be used.

The buildup insulating layers 2 cover the wiring conductors 5, described in detail later, at the upper and lower surfaces of the core insulating layer 1, and have the function of securing insulation between the wiring conductors 5 adjacent to each other. Furthermore, each of the buildup insulating layers 2 includes a plurality of via holes 8 of which bottom surfaces are defined by the wiring conductors 5. The via holes 8 include first via holes 8a in the first insulating layer 2a and second via holes 8b in the second insulating layer 2b.

A thickness of the first insulating layer 2a is set to, for example, 30 to 40 μm. The first insulating layer 2a includes the first via holes 8a of which bottom surfaces are defined by the wiring conductors 5. A diameter of each first via hole 8a is set to, for example, 30 to 60 μm.

A thickness of the second insulating layer 2b is set to, for example, 5 to 15 μm. The second insulating layer 2b includes the second via holes 8b of which bottom surfaces are defined by the wiring conductors 5. A diameter of each second via hole 8b is set to, for example, 10 to 20 μm.

The buildup insulating layer 2 is formed, for example, by preparing a film for the insulating layer, the film being made of a thermosetting resin such as an epoxy resin and containing the insulating particles 3 dispersed therein, by coating the film over each of the upper and lower surfaces of the core insulating layer 1 under vacuum in a covering relation to the wiring conductors 5, and by thermally curing the coated film.

The insulating particles 3 are positioned in the first insulating layer 2a and the second insulating layer 2b. The insulating particles 3 are made of silica ($SiO_2$), glass, or alumina, for example. The insulating particles 3 have a spherical shape, for example, and an average particle size is set to, for example, 0.1 to 0.5 μm. A content of the insulating particles 3 in the first insulating layer 2a and the second insulating layer 2b is set to, for example, 40 to 80 wt %. The spherical shape is advantageous in causing the insulating layer to contain the insulating particles 3 at a higher density. The insulating particles 3 in the first insulating layer 2a and the second insulating layer 2b have the function of, for example, reducing the thermal expansion coefficient and suppressing disconnection of the wiring conductors 5.

Figure 2:
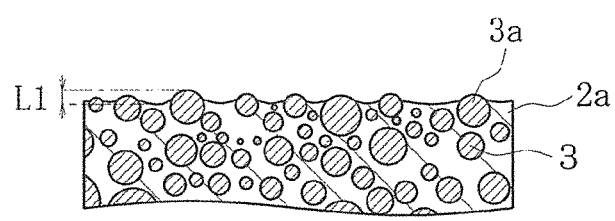
FIG. 2 is an enlarged sectional view of a first insulating layer in the wiring board according to the present disclosure.

The insulating particles 3 include partly exposed particles 3a of which surfaces are partly exposed at a surface of the first insulating layer 2a and a surface of the second insulating layer 2b. An area rate of exposed portions of the partly exposed particles 3a occupying in the surface of the first insulating layer 2a is set to, for example, 20 to 30% when viewed in plan. Furthermore, as illustrated in FIG. 2, a first level difference L1 of the unevenness in the first insulating layer 2a attributable to the insulating particles 3 is set to, for example, 160 to 600 nm when viewed in section. The term "area rate" stands for a rate at which an area (A) of the exposed portions of the partly exposed particles 3a when viewed in plan occupies in the surface (including above A) of the first insulating layer 2a or the second insulating layer 2b.

Figure 3:
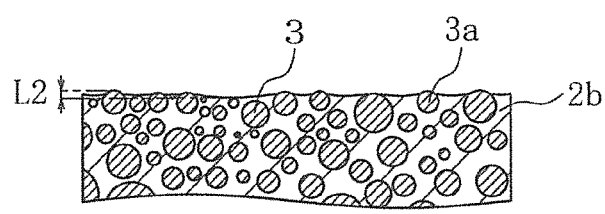
FIG. 3 is an enlarged sectional view of a second insulating layer in the wiring board according to the present disclosure.

An area rate of exposed portions of the partly exposed particles 3a occupying in the surface of the second insulating layer 2b is set to, for example, 5 to 12% when viewed in plan. Furthermore, as illustrated in FIG. 3, a second level difference L2 of the unevenness in the second insulating layer 2b attributable to the insulating particles 3 is set to, for example, 10 to 100 nm when viewed in section. The above-mentioned area rate of the partly exposed particles 3a can be determined by XPS analysis, for example.

The insulating particles 3 can be exposed at the surface of the second insulating layer 2b by treatment using oxygen plasma, nitrogen plasma, or argon plasma, for example. Although the plasma treatment takes a longer treatment time than treatment using an etchant, the plasma treatment is advantageous in increasing accuracy of a degree at which the insulating particles 3 are exposed, because fine grinding can be performed.

Figure 4:
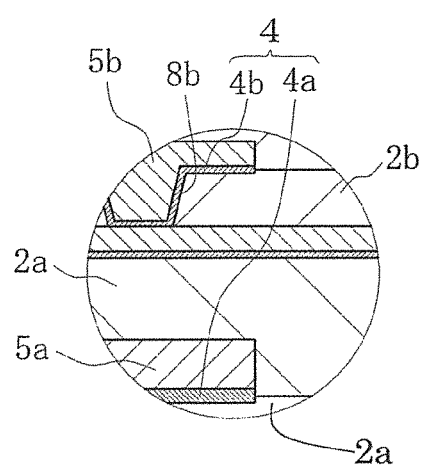
FIG. 4 is an enlarged sectional view of wiring conductors and the vicinity thereof in the wiring board according to the present disclosure.

As illustrated in FIG. 4, the underlying metal layers 4 include the first underlying metal layer 4a and the second underlying metal layer 4b. The first underlying metal layer 4a is positioned in a state spanning from a surface to the inside of the first buildup insulating layer 2a under a first wiring conductor 5a, described later. The first underlying metal layer 4a is further positioned on the surface of the wiring conductor 5 exposed at the bottom surface of each the first via hole 8a.

The first underlying metal layer 4a contains a metal having good electrical conductivity, such as copper. The first underlying metal layer 4a is formed by electroless plating, for example. The electroless plating is advantageous in that the plating time is comparatively short.

The second underlying metal layer 4b is positioned in a state spanning from a surface to the inside of the second buildup insulating layer 2b under a second wiring conductor 5b, described later. The second underlying metal layer 4b is further positioned on the surface of the wiring conductor 5 exposed at the bottom surface of each the second via hole 8b.

The second underlying metal layer 4b contains, for example, a metal belonging to the group IV of the periodic table, such as titanium, or a metal belonging to the group VI of the periodic table, such as chromium or molybdenum, and copper on such a metal. A thickness of the metal belonging to the group IV or the group VI is set to, for example, 20 to 25 nm. A thickness of copper is set to, for example, 200 to 220 nm. By setting the thickness of the metal belonging to the group IV or the group VI to be smaller than that of copper as described above, the second wiring conductor 5b on the second underlying metal layer 4b can be constituted by continuous and homogeneous crystal grains free from aggregation of the crystal grains.

In addition, the metal belonging to the group IV or the group VI is advantageous, for example, in suppressing diffusion of copper used as the material of the wiring conductor 5. It is hence possible to increase the strength of adhesion between the wiring conductor 5 and the insulating layer, and to suppress migration that may occur due to the diffusion of copper into the insulating layer.

The second underlying metal layer 4b is positioned in a state spanning from the surface to the inside of the second buildup insulating layer 2b with a depth smaller than 200 nm in a thickness direction. The above-mentioned thickness of the second underlying metal layer 4b can be determined by Auger analysis, for example.

The metal belonging to the group IV or the group VI and copper on that metal are formed by sputtering, for example. The sputtering is more advantageous than the electroless plating in point of increasing the strength of adhesion between the buildup insulating layer 2 and the second underlying metal layer 4b because the metal belonging to the group IV or the group VI and copper are implanted from the surface to the inside of the buildup insulating layer 2 by the sputtering. Thus, since the strength of adhesion between the buildup insulating layer 2 and the second wiring conductor 5b is increased, the sputtering is advantageous particularly when the second wiring conductor 5b is in the form of fine wiring.

The underlying metal layers 4 in regions other than regions where the wiring conductors 5 are present are removed by etching to prevent short-circuiting.

The wiring conductors 5 are positioned on the upper and lower surfaces of the core insulating layer 1, inside the through-holes 7, on the surfaces of the buildup insulating layers 2, and inside the via holes 8. The wiring conductors 5 include the first wiring conductor 5a and the second wiring conductor 5b. The wiring conductors 5 are formed by plating, such as a semi-additive process, and contain a metal having good electrical conductivity, such as copper.

The first wiring conductor 5a is positioned on the surface of the first insulating layer 2a and inside the first via holes 8a, and has the function of connecting the highly functional integrated circuit S and the wiring conductors 5 on the lower surface of the wiring board 20 as described above. A line width of the first wiring conductor 5a is set to, for example, 15 to 20 μm, and a thickness thereof is set to, for example, 10 to 20 μm. Thus, because of the first wiring conductor 5a having the comparatively large line width and thickness, even when the first level difference L1 of the unevenness of the first insulating layer 2a is the above-mentioned comparatively large value, i.e., 160 to 600 nm, the first wiring conductor 5a is less affected by the unevenness.

The second wiring conductor 5b is positioned on the surface of the second insulating layer 2b and inside the second via holes 8b, and has the function of connecting the highly functional integrated circuit S and the high bandwidth memories M as described above. A line width of the second wiring conductor 5b is set to, for example, 2 to 6 μm, and a thickness thereof is set to, for example, 2 to 15 μm. Thus, in spite of the second wiring conductor 5b having the comparatively small line width and thickness, since the second level difference L2 of the unevenness of the second insulating layer 2b is the above-mentioned comparatively small value, i.e., 10 to 100 nm, the second wiring conductor 5b is less affected by the unevenness.

The solder resists 6 are positioned on the surfaces of the second insulating layers 2b as uppermost and lowermost layers. The solder resists 6 include openings 6a where the second wiring conductor 5b in the uppermost layer is exposed, and openings 6b where the second wiring conductor 5b in the lowermost layer is exposed. The solder resists 6 are formed, for example, by bonding films of a thermosetting resin with photosensitivity, such as an acrylic-modified epoxy resin, over the surfaces of the second insulating layers 2b, by forming the openings 6a and 6b in the films with exposure and development, and by thermally curing the films.

In the wiring board 20 according to the present disclosure, as described above, the second level difference L2 of the unevenness in the surface of the second insulating layer 2b is smaller than the first level difference L1 of the unevenness in the surface of the first insulating layer 2a. Furthermore, the second level difference L2 is held not more than ⅖ of the average particle size of the insulating particles 3. Therefore, the second wiring conductor 5b being smaller in wiring width and thickness than the first wiring conductor 5a and having the flat surface can be formed on the surface of the second insulating layer 2b.

When the second level difference L2 is not more than ⅖ (including the case of L2=0) of the average particle size of the insulating particles 3, portions of the insulating particles (particularly the partly exposed particles 3a), the portions being positioned inside the second insulating layer 2b, are larger than exposed portions thereof in terms of average. Thus, such a condition is advantageous in suppressing dropping-out of the insulating particles 3.

If the second level difference L2 is less than ¹⁄₁₀ of the average particle size of the insulating particles 3, there would be a possibility that the adhesion between the second wiring conductor 5b and the second insulating layer 2b becomes insufficient under strong influence of a fragile surface layer that is produced when the second insulating layer 2b is thermally cured. Another possibility is that, when the second underlying metal layer 4b on the surface of the second insulating layer 2b is etched away, an etchant is more apt to infiltrate the second underlying metal layer 4b just under the second wiring conductor 5b, and that the second wiring conductor 5b tends to peel off.

When the second level difference L2 is not more than ⅖ and not less than ¹⁄₁₀ of the average particle size of the insulating particles 3, the surface of the second insulating layer 2b can be obtained in a resin surface condition suitable for forming the second wiring conductor 5b on the second insulating layer 2b. This is advantageous in forming wirings with good transfer characteristics for high frequency signals while increasing the strength of adhesion between the second insulating layer 2b and the second wiring conductor 5b.

If the second level difference L2 is more than ⅖ of the average particle size of the insulating particles 3, the insulating particles 3 in the second insulating layer 2b would be more apt to drop out. Accordingly, the unevenness in the surface of the second insulating layer 2b would be increased, and a fine wiring process would be difficult to carry out. Another possibility is that the unevenness in the surface of the second wiring conductor 5b would be increased under strong influence of the unevenness in the surface of the second insulating layer 2b, and that the transfer characteristics of high frequency signals would degrade.

The first level difference L1 can be arbitrarily set in comparison with the particle size of the insulating particles 3. From the viewpoint of suppressing dropping-out of the insulating particles 3 in the first insulating layer 2a, however, the first level difference L1 is preferably set to be not more than ⅘ of the average particle size of the insulating particles 3.

Moreover, in the wiring board 20 according to the present disclosure, since the second underlying metal layer 4b is positioned in the state spanning from the surface to the inside of the second buildup insulating layer 2b, the strength of adhesion between the second buildup insulating layer 2b and the second underlying metal layer 4b is high. As a result, the strength of adhesion between the second wiring conductor 5b on the second underlying metal layer 4b and the second buildup insulating layer 2b is also increased.

Thus, the wiring board 20 according to the present disclosure can be obtained as a wiring board having good transfer characteristics of high frequency signals and high adhesion between the wiring conductor and the insulating layer.

It is to be noted that the present disclosure is not limited to the above-described example, and that the wiring board 20 can be variously modified insofar as not departing from the gist of the present disclosure. For instance, while the first underlying metal layer 4a is formed by the electroless copper plating in the above-described example, the first underlying metal layer 4a may contain, for example, a metal belonging to the group IV of the periodic table, such as titanium, or a metal belonging to the group VI of the periodic table, such as chromium or molybdenum, similarly to the second underlying metal layer 4b. When the first underlying metal layer 4a contains the metal belonging to the group IV or the group VI, the first underlying metal layer 4a is positioned in a state spanning from the surface to the inside of the first insulating layer 2a with a depth smaller than 600 nm in the thickness direction. Such an example is advantageous in increasing the strength of adhesion between the first insulating layer 2a and the first wiring conductor 5a.

Figure 5:
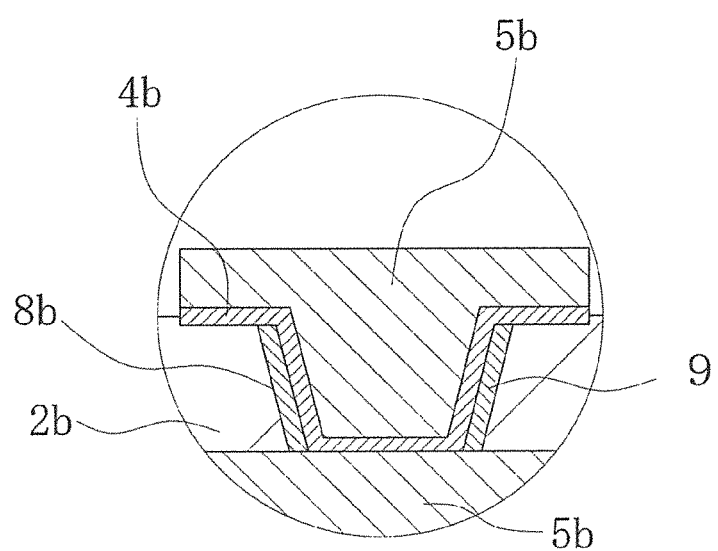
FIG. 5 is a schematic sectional view illustrating another example of the wiring board according to the present disclosure.

Furthermore, as illustrated in FIG. 5, an intermediate layer 9 may be present between a wall surface of the second via hole 8b and the second underlying metal layer 4b. The intermediate layer 9 includes, for example, part of the second insulating layer 2b, the insulating particles 3, and a metal phase containing copper. The metal phase containing copper contains, as described below, part of a metal phase that constitutes the second wiring conductor 5b in the second via hole 8b. Thus, at the wall surface of the second via hole 8b, the second wiring conductor 5b and the intermediate layer 9 both containing copper are positioned in a sandwiching relation to the second underlying metal layer 4b. The metal phase in the intermediate layer 9 is not illustrated in the drawing because the metal phase is present substantially over the same region as the whole of the intermediate layer 9.

A thickness of the intermediate layer 9 is set to, for example, about 100 to 1000 nm. If the thickness of the intermediate layer 9 is smaller than 100 nm, there would be a possibility that an increase of adhesion force between the second wiring conductor 5b and the wall surface of the second via hole 8b is not expected. If the thickness of the intermediate layer 9 is greater than 1000 nm, there would be a possibility that insulation reliability between the wall surfaces of the second via holes 8b is reduced.

The above-mentioned intermediate layer 9 can be formed, by way of example, as follows. First, a hole having a bottom surface defined by the wiring conductor 5 is formed in the second insulating layer 2b by laser processing. At that time, fine unevenness is formed in a wall surface of the hole with application of heat during the laser processing. The rugged wall surface is constituted by the second insulating layer 2b and the insulating particles 3. A degree of the unevenness is set to about 300 to 500 nm at a maximum height. As a condition for the laser processing, irradiation energy is set to, for example, 0.05 to 0.7 W. The laser processing can be more reliably implemented by limiting the irradiation energy to a range of 0.1 to 0.3 W.

Then, an inner surface of the above-mentioned hole is cleaned by desmear processing, whereby the second via hole 8b is formed. As conditions for the desmear processing, for example, a chemical solution containing a permanganate and an alkali metal hydroxide at a concentration of 0.2 to 0.5 mol/liter is prepared at temperature of 30 to 80° C., and the desmear processing is performed for a time of 0.5 to 10 minutes using the prepared chemical solution.

Then, the second underlying metal layer 4b is formed on the wall surface of the second via hole 8b and the surface of the wiring conductor 5. A thickness of the second underlying metal layer 4b is set to such a value as not completely cover the unevenness in the wall surface of the hole. In other words, the thickness of the metal belonging to the group IV or the group VI of the periodic table is set to, for example, about 5 to 20 nm, and the thickness of copper is set to, for example, about 50 to 150 nm.

Finally, the second wiring conductor 5b containing copper is formed in the second via hole 8b by a semi-additive process. At that time, part of the metal phase constituting the second wiring conductor 5b enters the unevenness in the wall surface of the hole through the second underlying metal layer 4b, and comes into close contact with the second insulating layer 2b and the insulating particles 3 both constituting the rugged surface. Rugged portions of the second insulating layer 2b, the insulating particles 3, and the metal phase having entered the unevenness in the wall surface of the hole are positioned in the layered form. Thus, the intermediate layer 9 including the part of the second insulating layer 2b, the insulating particles 3, and the metal phase containing copper is formed.

In the intermediate layer 9, as described above, the part of the metal phase constituting the second wiring conductor 5b is in close contact with the second insulating layer 2b and the insulating particles 3 in a state infiltrating through the second underlying metal layer 4b. The metal phase in the intermediate layer 9 and the metal phase constituting the second wiring conductor 5b are constituted by continuous crystals. Therefore, the second wiring conductor 5b can be held even in the small-diameter via hole 8 having a relatively small contact area, such as the second via hole 8b, with large adhesion force.

The intermediate layer 9 may be further positioned at a periphery of the bottom surface of the second via hole 8b in addition to the wall surface of the second via hole 8b. The intermediate layer 9 at the periphery of the bottom surface is present over a range of 6 μm at maximum, for example, from the bottom surface. Such a modification is advantageous in increasing the adhesion force between the second wiring conductor 5b and the wall surface of the second via hole 8b.

The intermediate layer 9 may be further positioned between a wall surface of the first via hole 8a and the first underlying metal layer 4a. Such a modification is advantageous in increasing the adhesion force between the first wiring conductor 5a and the wall surface of the first via hole 8a.

What is claimed is:

1. A wiring board comprising:
   a first insulating layer that has a surface with a first level difference of unevenness;
   a second insulating layer that is laminated on the first insulating layer and has a surface with a second level difference of unevenness, wherein the second insulating layer is made of an insulating material of same type as an insulating material of the first insulating layer;
   a plurality of insulating particles contained in each of the first insulating layer and the second insulating layer, wherein the insulating particles contained in each of the first insulating layer and the second insulating layer include partly exposed particles that are exposed at the surface of the first insulating layer and the surface of the second insulating layer respectively and form the first level difference of unevenness and the second level difference of unevenness;

a first underlying metal layer positioned on the surface of the first insulating layer;

a second underlying metal layer positioned on the surface of the second insulating layer, wherein the second level difference of the unevenness is smaller than the first level difference;

a first wiring conductor on the first underlying metal layer; and a second wiring conductor on the second underlying metal layer, wherein an area rate of exposed portions of the partly exposed particles occupying in the surface of the first insulating layer is 20 to 30% when viewed in plan, and the area rate of exposed portions of the partly exposed particles occupying in the surface of the second insulating layer is 5 to 12% when viewed in plan.

2. The wiring board according to claim 1, wherein the second underlying metal layer contains a metal belonging to the group IV or the group VI of the periodic table.

3. The wiring board according to claim 2, wherein the second wiring conductor contains copper, the second insulating layer comprises a via hole comprising a wall surface on which the second underlying metal layer is positioned, and an intermediate layer comprising part of the second insulating layer, the insulating particles, and a metal phase containing copper is positioned between the second underlying metal layer and the wall surface of the via hole.

4. The wiring board according to claim 1, wherein the second wiring conductor contains copper, the second insulating layer comprises a via hole comprising a wall surface on which the second underlying metal layer is positioned, and an intermediate layer comprising part of the second insulating layer, the insulating particles, and a metal phase containing copper is positioned between the second underlying metal layer and the wall surface of the via hole.

5. The wiring board according to claim 1, wherein the second underlying metal layer contains a metal belonging to the group IV or the group VI of the periodic table, and a copper layer formed on the metal, and a thickness of the metal is smaller than that of the copper layer.

6. The wiring board according to claim 1, wherein the second level difference is not more than $2/5$ and not less than $1/10$ of an average particle size of the insulating particles.

7. The wiring board according to claim 1, wherein the first level difference is not more than $4/5$ of an average particle size of the insulating particles.

8. The wiring board according to claim 1, wherein the first underlying metal layer contains a metal belonging to the group IV or the group VI of the periodic table.

9. The wiring board according to claim 8, wherein the first wiring conductor contains copper, the first insulating layer comprises a via hole comprising a wall surface on which the first underlying metal layer is positioned, and an intermediate layer comprising part of the first insulating layer, the insulating particles, and a metal phase containing copper is positioned between the first underlying metal layer and the wall surface of the via hole.

10. The wiring board according to claim 1, wherein the first wiring conductor contains copper, the first insulating layer comprises a via hole comprising a wall surface on which the first underlying metal layer is positioned, and an intermediate layer comprising part of the first insulating layer, the insulating particles, and a metal phase containing copper is positioned between the first underlying metal layer and the wall surface of the via hole.

11. The wiring board according to claim 1, wherein a content of the insulating particles in at least on of first insulating layer and the second insulating layer is 40 to 80% by weight.

* * * * *